United States Patent [19]

Rosenblum

[11] Patent Number: 4,468,757
[45] Date of Patent: Aug. 28, 1984

[54] METHOD OF OPERATING MAGNETIC BUBBLE MEMORY DEVICE IN MULTIPAGE MODE

[75] Inventor: Robert J. Rosenblum, Brighton, Mass.

[73] Assignee: Texas Instruments Incorporated, Dallas, Tex.

[21] Appl. No.: 887,157

[22] Filed: Mar. 16, 1978

Related U.S. Application Data

[62] Division of Ser. No. 789,390, Apr. 21, 1977, Pat. No. 4,161,788.

[51] Int. Cl.³ .............................................. G11C 19/08
[52] U.S. Cl. ....................................... 365/12; 365/15
[58] Field of Search ............................. 365/15, 16, 12

[56] References Cited

U.S. PATENT DOCUMENTS 4,133,043  1/1979  Hiroshima et al. ................. 365/15

OTHER PUBLICATIONS

IEEE Transactions on Computers, Nov. 1975, pp. 1125-1129.

Primary Examiner—James W. Moffitt
Attorney, Agent, or Firm—Thomas G. Devine; Leo N. Heiting; Melvin Sharp

[57] ABSTRACT

A magnetic bubble memory system controller is provided to interface a user system and a magnetic domain chip. The controller will functionally accept commands from a user system and deliver those same commands to the appropriate devices associated with the magnetic bubble memory. A further function of the controller device will be to enable multipage read and write functions within the major loop of a magnetic bubble memory chip organization.

8 Claims, 5 Drawing Figures

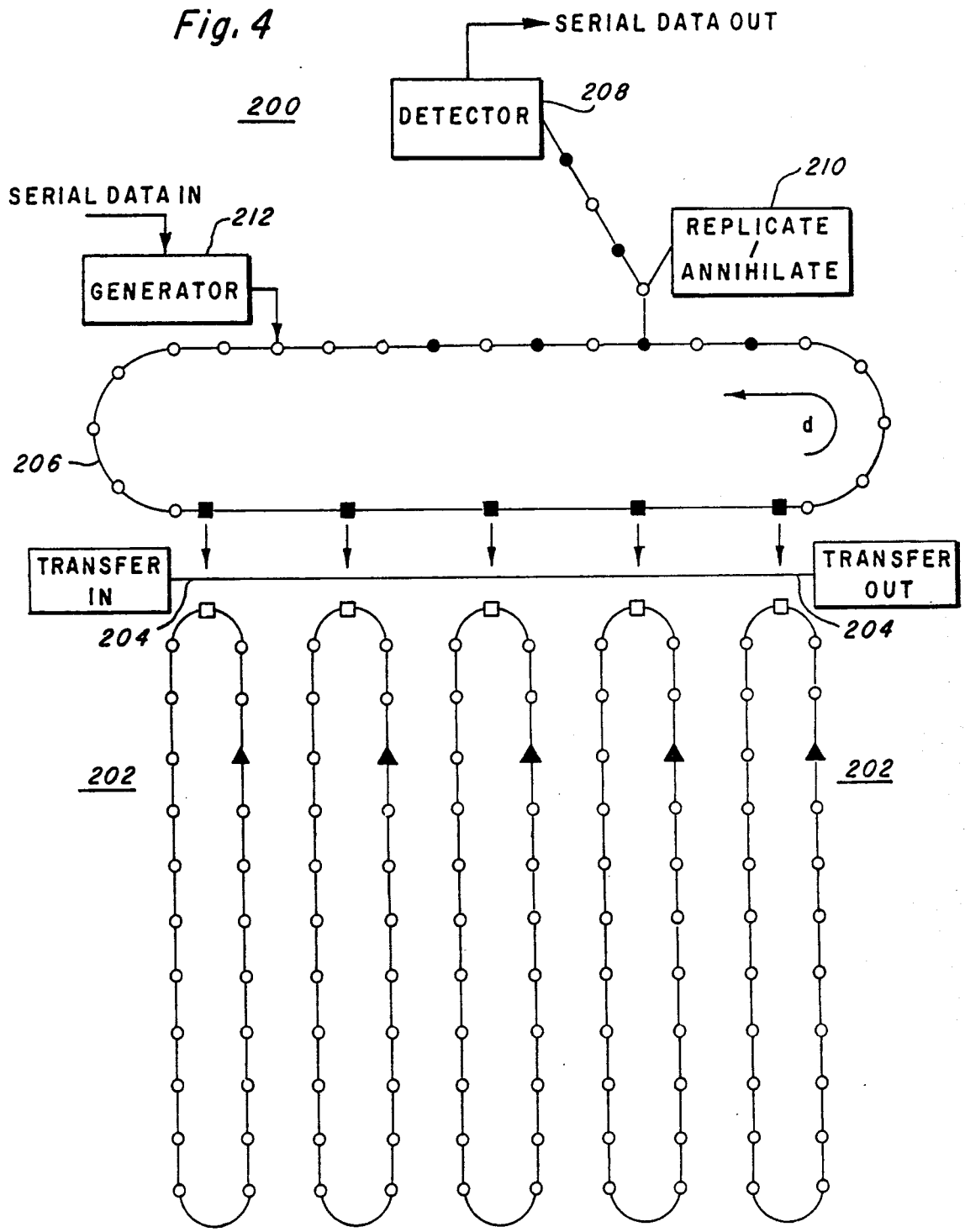

METHOD OF OPERATING MAGNETIC BUBBLE MEMORY DEVICE IN MULTIPAGE MODE

This is a division of application Ser. No. 789,390, filed Apr. 21, 1977, now U.S. Pat. No. 4,161,788.

The present invention pertains to a magnetic bubble memory system controller device and more particularly a controller device that regulates the various bubble-affecting functions of the magnetic domain chip and further allows for multipage read and write operations.

BACKGROUND OF THE INVENTION

In recent years, tremendous progress has been made in developing equipment for electronic data processing such that today high speed reliable hardware is available to the data processing designer. The newly developed electronic components, particularly those using integrated circuits, have greatly increased the capacity of modern electronic data processing equipment to process data. As the speed and capacity of processing has increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extremely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics,* Vol. MAG-5, No. 3 (1969), pp. 544–553, "Application of Orthoferrites to Domain-Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction substantially perpendicular to the plane and that small localized single domain regions of magnetic polarization aligned opposite to the general polarization direction may be supported. Such localized regions which are generally cylindrical in configuration represent binary memory bits. Interest in these devices in large part is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such material as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto, by a separate write connection, and by an erase connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically all of the minor loops in the chip, upon command, transfer in parallel the bubbles from their corresponding positions to the major loop. The bubbles are then serially detected as they are propagated past a read position. New data may also be inserted at a write position for parallel transfer back into the minor loops at an appropriate time later (when major loop magnetic domain propagation aligns the data for transfer). This operation may be characterized as a single page transfer of data, i.e. only one page of data in the major loop at any one time.

Simultaneous reading/writing of data into a grouping of related major loops gives the capacity of treating related magnetic domains as digital or other coded words. Time multiplexed groups of data chips permit reading and writing of data in a time sharing fashion to permit an overall memory data rate greater than that permitted by magnetic domain propagation in a single chip.

The major loop propagation path in the major-minor loop organization structure is large enough to hold more than one page of bubble information. A page is defined by a simultaneous transfer out of a bit from the same virtual position of every minor loop onto the major propagation path. However, it has heretofore been a general practice in the art to provide a single page of information within the bubble major propagation path at any one time as described above.

In order to initiate the bubble functions, as for example reading and writing from the bubble chip, it is necessary to have a controlling mechanism to filter command signals from the bubble user to the bubble memory device to enable the necessary bubble functions. The controllers used heretofore have been mainly of an unsophisticated type to simply initiate bubble functions. There is a distinct need for a more sophisticated controller in combination with a magnetic bubble memory device to perform more adequately as an interface with a user system. There is also the need that a controller be sophisticated enough to be able to handle magnetic bubble memory device replacement along with providing an efficient means of function timing to enable the chip to perform at its optimum level.

SUMMARY OF THE INVENTION

A preferred embodiment of a magnetic domain memory controller system in accordance with the present invention includes interface control circuitry accepting commands from a user system and delivering these commands to a sequence timing system. The sequencer is made up of a programmable memory having stored data relating to desired operating conditions, a comparator device for comparing the present bubble condition with a specific operating condition and an address register which points to any new operating condition the user might wish to implement based on present conditions. The controller is further comprised of a page locating combination of counters and registers enabling the user to monitor which page of data the bubble is presently accessing or writing. This page locating combination then compares the present page with the page the user desires to read or write. A signal is then provided to enable the sequence timing function which controls the operation of the memory device by sending bubble function-enabling signals through an output latch buffer to the memory device.

The controller interfaces with the magnetic bubble memory device for data exchange by way of a data register and volatile memory for storing data as it is read out serially from the bubble device. This data is blocked out in a parallel format and then subsequently accessed by the user system. The magnetic bubble memory chip is also interfaced to the controller by way of an output buffer latch which enables the function timing of all key bubble functions. In order to determine the proper timing of bubble events, a major loop shift counter is loaded with information in the form of a number designating bubble propagation periods necessary for a magnetic bubble to move from one function timing device to another, as for example moving from a detector to an annihilator.

In order for the magnetic bubble memory system controller to more efficiently perform read and write operations, a multipage method of accessing data can be used. In order to read or write more than a single page into the major propagation path at any one time, a separate method of operation is initiated by the magnetic domain memory controller device as presented above.

The method comprises transferring out the first page desired by the user into the major loop and shifting that page to some appropriate point where bubble operations can begin (read and write). Subsequent in time to the first transfer, a time d propagation periods later, a second desired page of data is transferred into the major loop. Both pages are then appropriately shifted within the major loop to begin bubble operations on the second page, while completing operations on the first page. Finally both pages are shifted to align the first page with the minor loops for a transfer into the minor loops. At some further point in time 2d periods after the first transfer out, a third desired page may be transferred out to the major loop. This method of operation is continued until such time as all of the desired pages are read or written.

BRIEF DESCRIPTION OF THE DRAWINGS

FIG. 4 is a schematic view illustrating a magnetic bubble memory domain structure operating in a multipage mode.

DETAILED DESCRIPTION OF THE DRAWINGS

Controller

Figure 1A:
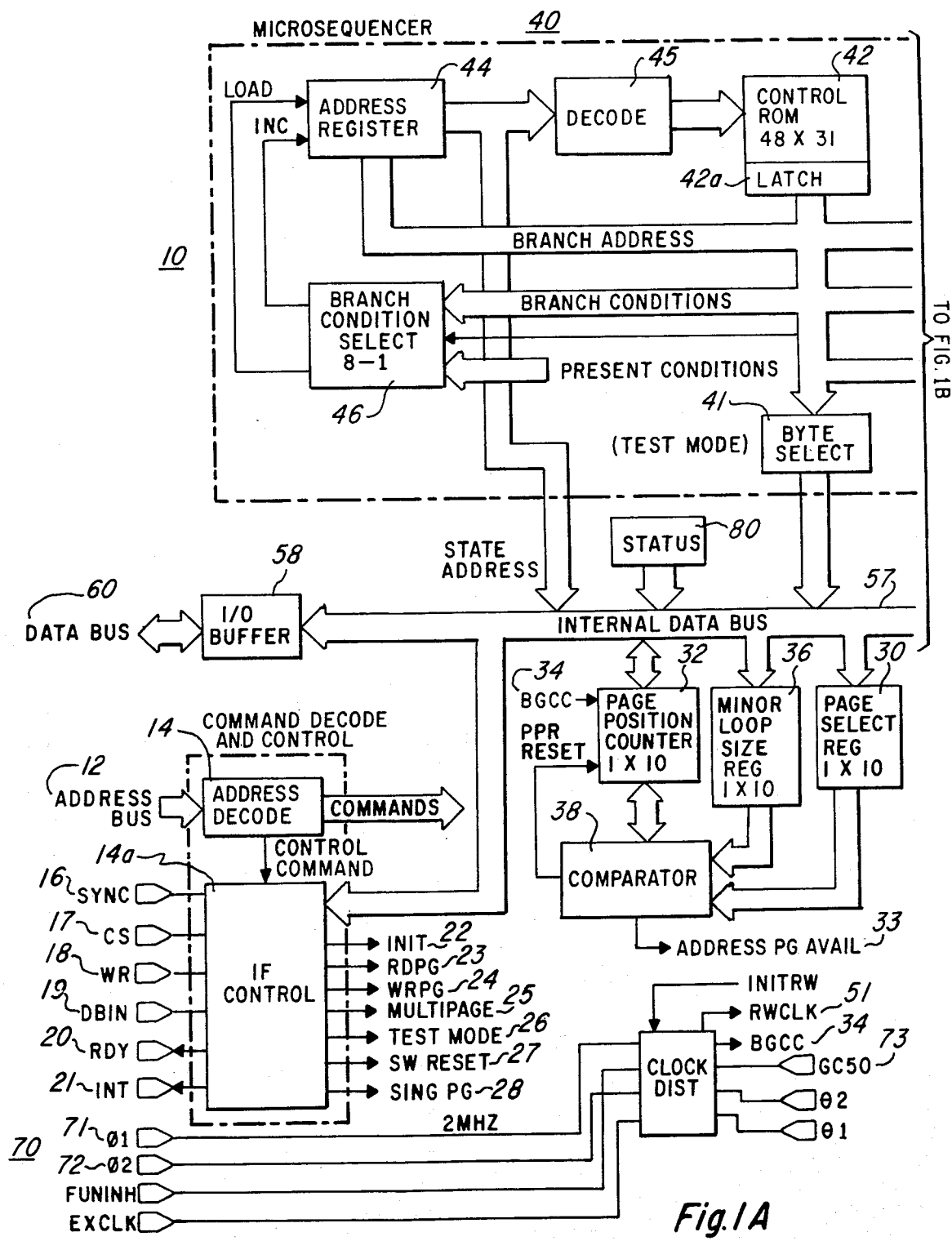
FIGS. 1A and 1B are block diagrams of a magnetic bubble memory controller in accordance with the present invention.
Figure 1B:
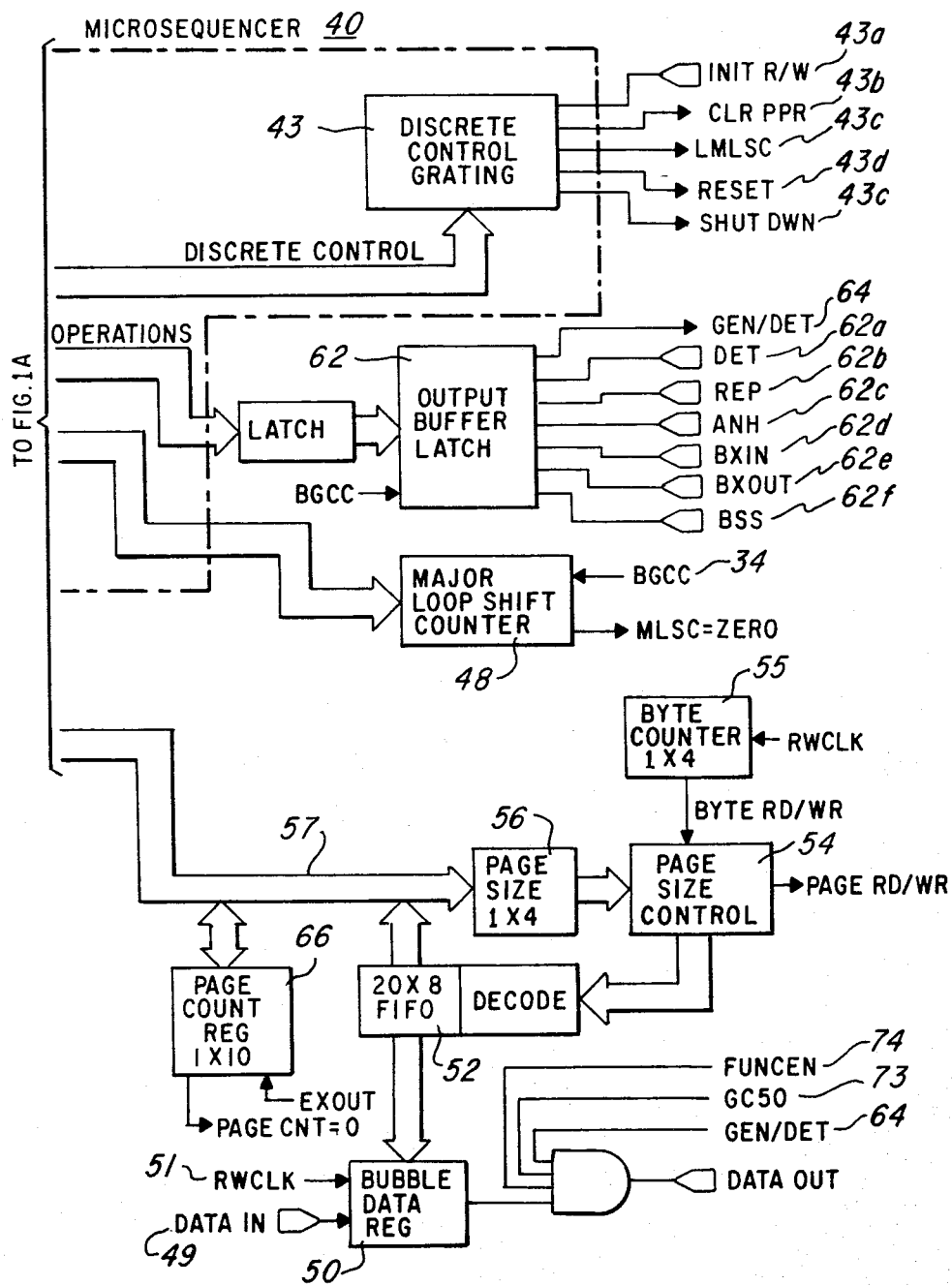

Referring now to the drawings and more particularly to FIGS. 1A and 1B, a magnetic domain memory system controller structure 10 is illustrated in a preferred embodiment of the invention. A user system (not shown) in the form of a TMS 8080 or TMS 9900 microprocessor manufactured by Texas Instruments Incorporated, Dallas, Tex., interfaces with the magnetic domain memory system controller 10 by way of address bus 12. Address bus 12 delivers four lines of information to the controller 10 which when properly decoded by address decoder 14, such as the address decoder model No. SN 74154 marketed by Texas Instruments Incorporated, Dallas, Tex., delivers commands to the control circuitry over fifteen separate lines. Conditional signals 16–21 are interfaced in interface control 14a with the control commands coming from address decoder 14 to enable the user system to specify which mode of operation of the magnetic bubble memory chip (not shown) it desires. External signal 16, SYNC, is a synchronization signal to the controller 10 indicating that a command sequence is starting. External control signal 17, CS, is a chip select input to the controller enabling the command decode logic 14. External control signal 18, WR, is a write signal to the controller indicating that the micro-processor or user is executing a write instruction. External control signal 19, DBIN, is a data bus-in signal to the controller indicating that the user is executing a read instruction. External control signals 20 and 21, RDY and INT, are signals generated by the controller to allow asynchronous commands from the user or control interface to indicate that data is ready to be read or written depending upon the mode of operation desired.

Internal control commands 22-28 are subsequently sent to bubble sequence apparatus 46. Control command 22, INIT, is a user command for the initialization of the magnetic bubble memory chip. Initialization includes starting the bubbles to rotate with the aid of a rotating magnetic field and powering up the annihilator to clear out any old data from the major propagation paths. Control command signals RDPG, 23 and WRPG, 24 represent a user command to read and write a page in the magnetic bubble memory respectively, where a page is defined as one bit of information from the same virtual position of each minor loop. Controller command signals 25 and 28 represent the mode of operation the user desires, namely multipage or single page operation. Multipage operation allows the user to operate with two pages of information in the major propagation path at one time. This concept will be described later in more detail. Control command signal 26, test mode, enables verification of the contents of control read only memory (ROM) 42, while command signal 27 SW reset is a software system reset pulse.

In order for the user to effectively read from or write to a specific page in the minor loop, it is necessary to know at all times the location of that page with respect to the bubble chip transfer or swap replicate gates which enable the read or write to occur. This information can be obtained by placing the desired page number in a page select register 30 similar to the hex D-type register Model SN 74174 manufactured and marketed by Texas Instruments Incorporated, Dallas, Tex., and comparing that page with the present page position. The present page position is stored by a page position counter 32 such as three loadable counters Model No. SN 74197, marketed by Texas Instruments Incorporated. The counter 32 receives a signal from a bubble gate shift clock 34 which monitors the number of propagation periods of the bubble chip thus enabling a running count of the pages. (There is one cycle of each bubble gate shift clock 34 for each bubble propagation period). A further consideration is the minor loop size stored in a minor loop size register 36 similar to the page select register 30. After the page position counter 32 reaches the minor loop size, it is reset to zero. A comparator 38, comparing the desired page position found in page select register 30 with the present page found in page position counter 32, signals the user when the desired page is available with an address page available signal 33. When the desired page becomes available, the appropriate transfer out signal will be transmitted to the memory device.

Figure 2:
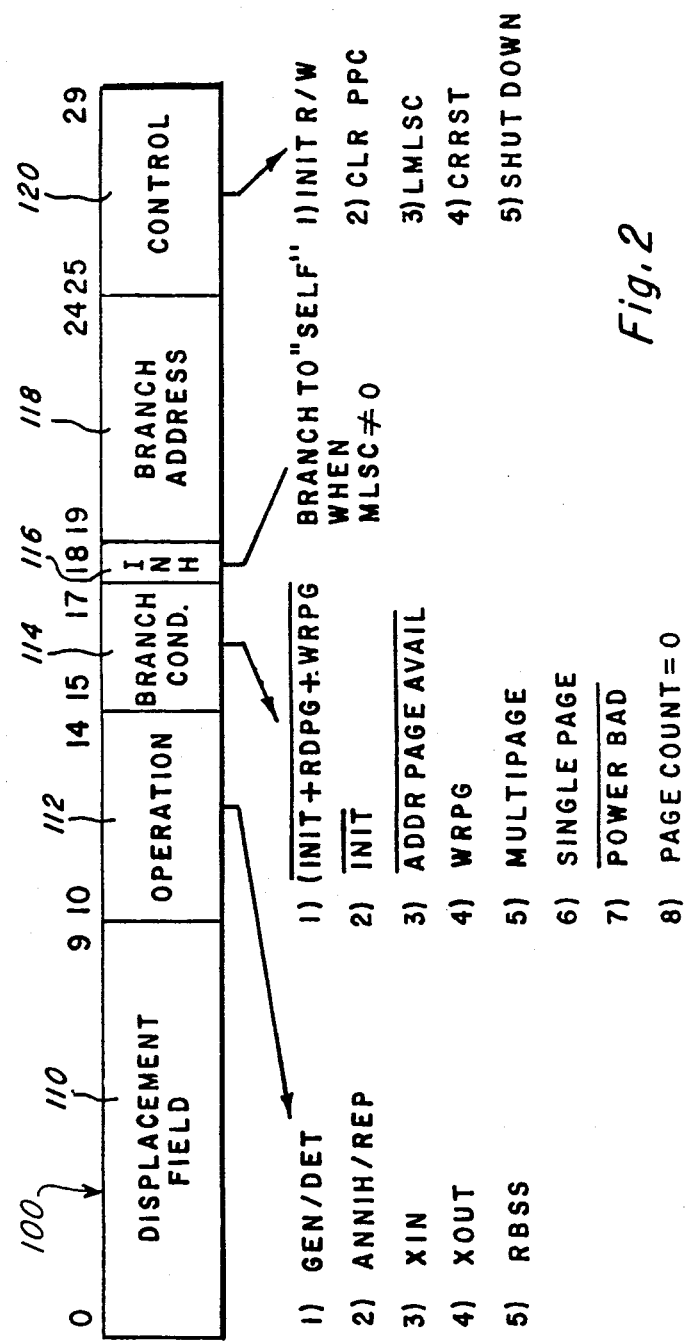
FIG. 2 is a block diagram illustrating the field assignments of a control word present in the read-only memory (ROM) of FIG. 1A.

In order to more completely describe the sequencing function of the controller, reference will now be made to FIGS. 1A and 1B, 2 and 3. FIGS. 1A and 1B show a microsequencer 40 having a control read only memory, ROM, 42 as the ROM Model No. TMS-4700 manufactured and marketed by Texas Instruments Incorporated, Dallas, Tex. The control ROM 42 contains 37 states comprising a string of 30 bits as shown in FIG. 2 and Table I. Each control word is made up of six individual field assignments. As shown in FIG. 2, control word 100 includes a displacement field 110 which comprises a 10-bit field used for counting 100 khz field rotations. The second field assignment, the operation 112 as shown in FIG. 2 consists of 5 bits which serve as an enabling mechanism to the bubble module along with serving as internal control signals. The 5 bits in the operation field assignment 112 represent a generator/detector bit, an annihilator/replicate bit, a transfer in bit, and transfer out bit, along with a bit representing the bubble start shifting function. The third field assignment in the control word 100 is branch condition 114, which consists of 3 bits used to determine which of eight present conditions the branch condition select logic will interrogate to determine if that condition is true at any one time. The eight present conditions are: (1) $\overline{(INIT+RDPG+WRPG)}$ not initializing, reading or writing, (2) $\overline{(INIT)}$ not initializing, (3) $(\overline{ADDR\ PAGE\ AVAIL})$ address page unavailable, (4) $\overline{(WRPG)}$ write, (5) multi-page, (6) single page, (7) $\overline{power\ bad}$ power good, and (8) page count=0. The fourth field of the control word 100 is a 1-bit inhibit field 116. If the bit is present and no other functions are being performed in the bubble device, the bubble device remains in the same state, i.e. the branch condition select logic is disabled. The branch address field assignment 118 is a 6-bit field containing the location of all 37 ROM states. The control field 120 comprises 5 bits performing the necessary control for the controller 10 to operate in the initiation of a read or write, clear the page position counter, load the major loop shift counter bit, reset the control ROM address register 44 and appropriate internal logic, and shut down after any read or write sequence to stop the bubble memory in the known position.

The microsequencer 40 also includes a branch condition select logic 46 in the form of a comparator such as that manufactured by Texas Instruments Incorporated, Dallas, Tex., Model SN 74L5151. An address register 44 receives one of two signals (LOAD and INC) from the branch condition select logic 46. If the LOAD signal is active, then the branch address from the control ROM latch 42a is loaded into the address register 44. If the INC signal is active, the contents of the address register 44 are incremented by one (binary). The address decoder 45 decodes the six bits from the address register 44 to address one of the 37 states of the control ROM 42. When the control ROM 42 is in any given state the sixth field assignment, control, having five bits will interface with the discrete control gating circuitry 43 to provide signals 43a-43e for internal control except for INIT R/W, 43a which may be used both internally and externally to initialize redundancy logic. Signal CLR PPR, 43b, will reset the page position register 32, while LMLSC 43c loads the displacement field of control ROM 42 into major loop shift counter 48, operationally described below. The reset signal 43d is an initialization signal resetting a series of registers internal to controller 10. Shutdown, 43e will signal shutdown of the magnetic bubble memory device. The byte select logic 41 is used in the test mode of the controller 10 to read the contents of control ROM 42 for the purpose of verification.

Operationally, the microsequencer 40 of the controller 10 is basically a simplified synchronous sequential machine whose states are distinct memory locations in the control ROM 42. As a state machine, the microsequencer 40 can move to one of three states from any present state.

A major loop shift counter 48 of the type manufactured by Texas Instruments Incorporated, Dallas, Tex., in the form of a loadable counter Model No. SN 74197, is connected to microsequencer 40. The major loop shift counter 48 is loaded with a number pertaining to the number of propagation periods needed to go from one function device to another in the magnetic bubble memory. An example of this is the movement of a bubble from a minor loop transfer port to the detector element, not shown in these figures.

Figure 3:
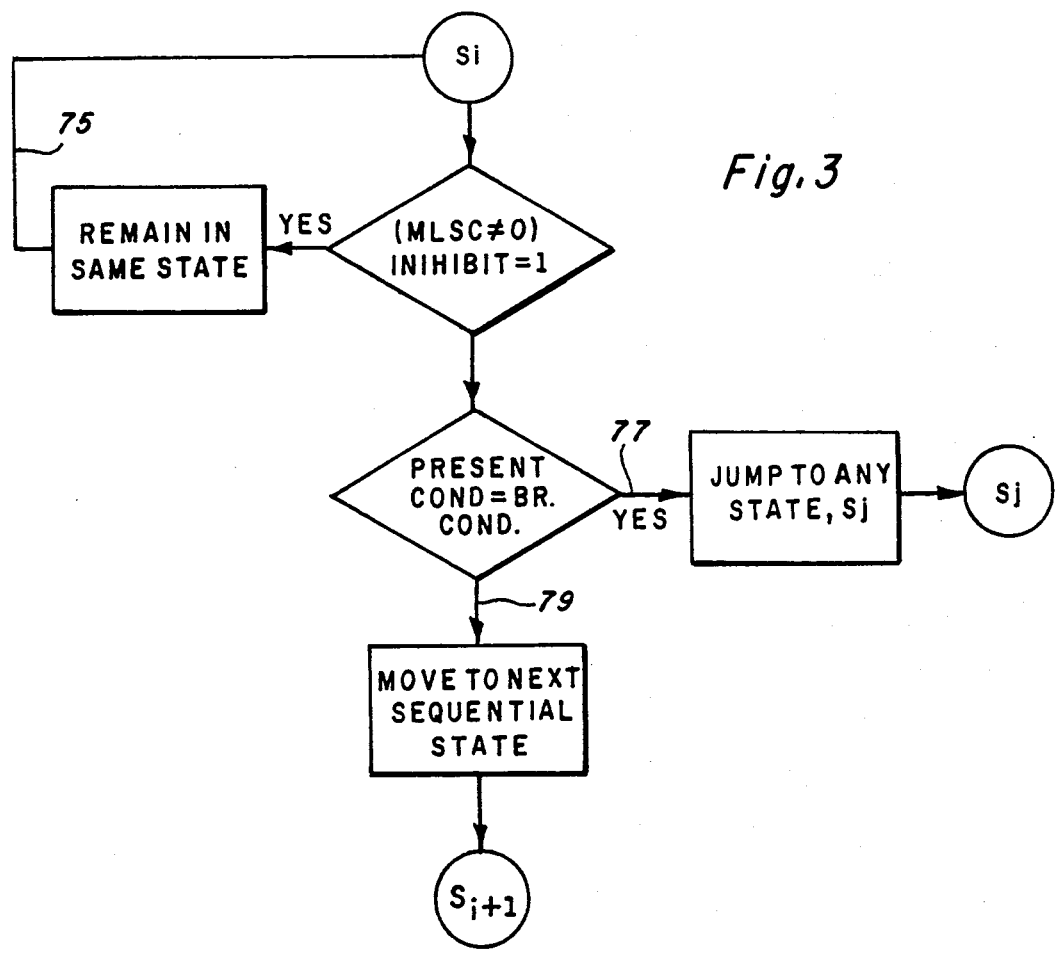
FIG. 3 is a state transition flow chart illustrating the function of the microsequencer of FIGS. 1A and 1B.

As shown in FIG. 3, in movements from one state to another, when a condition exists where the number stored in the major loop shift counter 48 does not equal of operation can be outlined. Table 2 reflects the code representing the branch conditions. If the status of the controller is not initialization, nor reading, nor writing to or from the bubble memory device, then the branch condition 000 is equal to the present condition and the controller will remain in the same state, e.g. state 0.

TABLE 1

Control States

| | DISPLACEMENT FIELD | | | | | | | | | | OPERATION | | | | | BRANCH CONDITION | | |
|---|---|---|---|---|---|---|---|---|---|---|---|---|---|---|---|---|---|---|
| | LSB | | | | | | | | | MSB | GEN/DET | ANNIH/REP | XIN | XOUT | RBSS | | LSB | |
| | 0 | 1 | 2 | 3 | 4 | 5 | 6 | 7 | 8 | 9 | 10 | 11 | 12 | 13 | 14 | 15 | 16 | 17 | 18 |
| 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 | 0 | 1 | 0 |
| 2 | 0 | 0 | 0 | 0 | 0 | 0 | 0 | 1 | 0 | 1 | 0 | 1 | 0 | 0 | 1 | 1 | 0 | 1 | 0 |
| 3 | 0 | 0 | 0 | 0 | 0 | 0 | 0 | 0 | 0 | 0 | 0 | 0 | 1 | 0 | 1 | 0 | 0 | 0 | 1 |
| 4 | 0 | 0 | 0 | 0 | 0 | 0 | 0 | 0 | 0 | 0 | 0 | 0 | 0 | 0 | 1 | 0 | 1 | 0 | 0 |
| 5 | 0 | 0 | 0 | 0 | 0 | 0 | 0 | 0 | 0 | 0 | 0 | 0 | 0 | 0 | 0 | 0 | 0 | 1 | 0 |
| 6 | 0 | 0 | 0 | 0 | 0 | 0 | 0 | 0 | 0 | 0 | 0 | 0 | 0 | 0 | 0 | 0 | 1 | 0 | 0 |
| 7 | 1 | 0 | 0 | 0 | 0 | 0 | 0 | 0 | 0 | 0 | 0 | 0 | 0 | 1 | 1 | 0 | 0 | 1 | 0 |
| 8 | 0 | 0 | 0 | 0 | 0 | 0 | 0 | 0 | 0 | 0 | 0 | 0 | 0 | 0 | 1 | 0 | 1 | 0 | 0 |
| 9 | 1 | 0 | 0 | 0 | 0 | 0 | 0 | 0 | 0 | 0 | 0 | 0 | 0 | 1 | 1 | 0 | 0 | 0 | 0 |
| 10 | 0 | 0 | 0 | 0 | 0 | 0 | 0 | 0 | 0 | 0 | 0 | 0 | 0 | 1 | 1 | 0 | 0 | 0 | 1 |

| | BRANCH ADDRESS | | | | | | CONTROL | | | | |
|---|---|---|---|---|---|---|---|---|---|---|---|
| | MSB | | | | | LSB | INITRW | CLRPPC | LMLSC | CR RST | SHUT DOWN |
| | 19 | 20 | 21 | 22 | 23 | 24 | 25 | 26 | 27 | 28 | 29 |
| 0 | 0 | 0 | 0 | 0 | 0 | 0 | 0 | 0 | 0 | 0 | 0 |
| 1 | 0 | 0 | 0 | 1 | 1 | 0 | 0 | 0 | 0 | 0 | 0 |
| 2 | 0 | 1 | 0 | 1 | 1 | 1 | 0 | 1 | 1 | 0 | 0 |
| 3 | 0 | 0 | 0 | 1 | 0 | 0 | 0 | 0 | 0 | 0 | 0 |
| 4 | 0 | 0 | 0 | 1 | 0 | 0 | 0 | 0 | 0 | 0 | 1 |
| 5 | 0 | 0 | 0 | 0 | 0 | 0 | 0 | 0 | 0 | 1 | 0 |
| 6 | 0 | 0 | 1 | 0 | 0 | 0 | 0 | 0 | 0 | 0 | 0 |
| 7 | 0 | 0 | 1 | 0 | 1 | 0 | 0 | 0 | 1 | 0 | 0 |
| 8 | 0 | 0 | 1 | 0 | 0 | 0 | 0 | 0 | 0 | 0 | 0 |
| 9 | 0 | 0 | 1 | 0 | 1 | 0 | 0 | 0 | 1 | 0 | 0 |
| 10 | 0 | 0 | 1 | 0 | 1 | 1 | 0 | 0 | 0 | 0 | 0 |

0 and the inhibit bit 116 is present the state will not change, as in loop 75. Loop 75 demonstrates this condition where Si represents the present state of the bubble device. However, if the number stored in the major loop shift counter 48 is equal to 0 and the inhibit field bit 116 is 1, then a further test is made as to whether the present conditions of the magnetic bubble device are equal to the branch conditions of that state as set out in the firmware of control ROM 42. This comparison is made by the branch condition select comparator 46, comparing the branch condition as set out in the control ROM field assignment, the present conditions received from the user, and from the internal conditions of the controller. If the branch condition determined from the control word is equal to the present condition selected, then the address register 44 of the control ROM 42 is loaded with the value of the branch address to point to a new state. This condition is shown in the flow chart of FIG. 3 as path 77 to new state SJ. If, however, none of these conditions is true, then the address register 44 is incremented to point to the next ROM 42 location, flow path 79 in FIG. 3 to state Si+1. Depending on which state of the control ROM 42 the system is using at present, the remainder of the field assignments of the control ROM 42 as shown in FIG. 2 will determine the other internal and external control conditions interfacing with both the user system and the magnetic bubble memory.

Referring now to Table 1, 11/37 states 30 bits long in the control ROM 42, are shown with each state representing a control word as described and illustrated in FIG. 2. Using Table 1 and beginning with state 0, a path

TABLE 2

Branch Conditions 0 0 0 ($\overline{INIT + READ + WRITE}$)   1 0 0 MULTIPAGE
0 0 1 $\overline{INIT}$   1 0 1 MULTIPAGE
0 1 0 $\overline{ADDR. PAGE AVAIL}$   1 1 0 $\overline{POWER BAD}$
0 1 1 WRITE   1 1 1 PAGE COUNT = 0

However, assuming the user puts out a read signal, then the present condition is not equal to the branch condition and the address decoder is incremented to point to the next step, or state 1 as shown in Table 1. Again, if a read instruction has been given when comparing the branch condition for state 1, which is "not initialization", which equals the present condition, the branch address 6 is loaded into address register 44 and points to state 6. Again, making the same test as to whether the present conditions equal the branch conditions and assuming a read instruction, the branch condition state is the "address page not available". Assuming that the address for the desired page is available, that is the condition is not true, the state transition flow chart in FIG. 3 shows that the address register will be incremented by 1 and point to the next sequential state, or state 7, where a control bit is present, namely LMLSC, which designates to load the major loop shift counter 48 shown in FIG. 1B with the displacement field 10 of FIG. 2. Operation control bits are also present in state 7 and designate that the bubble shift start and transfer out bubble function in the form of a transfer gate be set at this time. The branch condition in state 7 is not initialization, which is equal to the present condition of read and therefore the address decoder is loaded with the branch address in state 7 pointing to state 10. At this point the major loop shift counter 48 is not equal to 0 and state 10 shows the inhibit bit field 116 or bit 18 of 30 in the control word to be present; thus the controller will remain in state 10 until such time as the major loop shift counter 48 decrements to 0. The major loop shift counter 48 shown in FIG. 1B is decremented by a pulse, from bubble gate shift clock 34 representing a bubble propagation period until such time as the first bubble has reached the magnetic bubble replicator, and the bubble controller will remain in that same functional state.

Output buffer latch 62 contains the bubble module function enables. These enabling signals except GEN/-DET 64 are brought to external pins 62a–62f and are used by function timing logic external to controller chip 10 to manipulate bubble module functions. These functions include bubble detection (Det 62a), Replication (REP 62b), Annihilation (ANH 62c), Transfer in (BXIN 62d), and transfer out (BXOUT) 62d). After such time the controller 10 completes the read operation by moving to the appropriate states and setting the appropriate control bits in operation to functionally operate the magnetic bubble memory, data is acquired and can be requested by the user system. During a read operation, data is placed serially using pin 49 into a bubble data register 50, such as a data register marketed and manufactured by Texas Instruments Incorporated, Dallas, Tex., Model No. 74S299 which blocks out the serial data into 8-bit words. Data bytes are transferred in and out of the bubble data register using a RWCLK clock signal 51 taken from a clock distribution network of signals. All controller timing is derived from a 2 MHz 2 phase system clock 70. The 2 MHz clock 70 is divided down to generate two other phases 71, $\theta_1$, and 72, $\theta_2$, which are 100 KHz and 90° out of phase. $\theta_1$, 71, is gated with the bubble start shift signal (BSS) 62f from the microsequencer 40 to generate the bubble gated shift clock (BGCC) 34 used internal to the controller. A 50 KHz clock (GC50) is available on an external pin 73 and represents the data rate in the major loop of the memory device (shown in FIG. 4).

Data is shifted into and out of the controller 10 serially with a 50 KHz read/write clock (RWCLK) 51. This clock is gated with an external function enable (FUNCEN) signal 74 which forces the controller 10 to ignore defective minor loops in the memory device. These 8-bit words are then transferred into a volatile memory 52 controlled by a page size counter 54 such as that marketed by Texas Instruments Incorporated, Dallas, Tex., Model No. SN 74197. This page size counter 54 receives an input of page size from page size register 56 similar in type to a register marketed by Texas Instruments Incorporated, Dallas, Tex., Model SN 74174, and a further counter 55 that monitors the number of bits such as a counter marketed by Texas Instruments Incorporated, Dallas, Tex., Model No. SN 74197. Thus, the user is able to access only those 8-bit words that make up the full page of the information desired from the bubble memory device. The 8-bit words are sent by way of an internal data bus 57 to bidirectional input-output buffer 58 such as the buffer marketed by Texas Instruments Incorporated, Dallas, Tex., Model No. SN 74LS243. The user system is then capable of accessing the data from the I/O Buffer 58 by way of external data bus 60. In the multipage mode described below, a page count register 66 is used in page transfers to the external processor to hold the desired block size to be transferred under a read or write page command.

Status of the controller 10 is maintained by status register 80 which can be read by an external processor. An example of a status condition represented by one bit in this 8-bit counter is when the controller is busy that is reading or writing data to the memory device.

Single Page Operation

At some point in time, the user will determine whether he wants to use a single or multipage operation. In order to facilitate description of the single and multipage operations reference will now be made to FIG. 4, a magnetic bubble memory device having a major/minor loop configuration. The controller 10 illustrated in FIGS. 1A and 1B described above will have the appropriate control and operation bits stored as firmware in the control ROM 42. This firmware will respond to a user command setting the present conditions desired by use of the interface control, 14a.

In single page read operation, where a page is defined as 1 bit from the same virtual position of each minor loop, a page is transferred from the plurality of minor loops 202 by way of transfer port 204 to major loop 206. The transferred bubbles will propagate around major loop 206 until reaching a replicate port which duplicates the bubble into two parts leaving one part to rotate within the major loop 206 and the other part to propagate to a detector 208. The magnetic bubbles are then rotated back to their respective positions above the plurality of minor loops 202 where they are transferred back into those minor loops.

The controller chip 10 shown in FIG. 1 will initiate the devices peripheral to the major/minor loop configuration, namely, transfer port 204, read port 208, replicator/annihilator 210 and generator 212. The output buffer latch 62 shown in FIG. 1B contains the bubble module function enables. All of the signals except the generate/detector signal 64 are brought to external pins for use by function timing logic external to the control chip 10. A generate signal in the write mode is gated internally with the controller output data.

By defining single page operation in this manner, it is possible to compute a data rate for a magnetic bubble memory. For single page operation to read or write one page of data, the minimum time is one minor loop revolution. For two pages of data, the time involves two minor loop revolutions plus the access time to get to the second page from the first. This access time is a minimum of one bubble propagation period. For n pages, it is necessary to rotate n revolutions plus a minimum of n bubble propagation steps.

FIG. 4 shows a magnetic bubble memory system 200 having a plurality of pages present in the major loop 206 at any one time. The empty circles in both the plurality of minor loops 202 and the major loop 206 represent positions on both those paths capable of supporting magnetic domains. The filled in circles, squares and triangles represent magnetic bubbles. However, each different geometry represents a specific page of data, with a page designated by a series of five magnetic domains one from each of the minor loops 202.

Multipage Operation

The multipage operation is a method of handling two or more pages of data in a manner that yields a significant increase in the effective data rate over that obtained with a single page approach. It accomplishes this by placing two or more pages of data in the major loop at one time.

In order to achieve this result without having a conflict of two pages of data overlapping in the major loop, the order of operations is as follows: (1) transfer out the first desired page into the major loop; (2) shift to an appropriate point and begin operations (read or write); (3) at some point d propagation periods after the transfer, transfer out the second page of data onto the major loop; (4) shift both pages to an appropriate point and begin operations on the second page; (5) at some point (M−1) clock cycles after the first transfer out, where M is equal to the number of major loop positions, transfer the first page back into the minor loops; (6) at the point 2d periods after the first transfer out, transfer the third page out into the major loop. This method can be continued until the required number of pages have been operated on. Furthermore, this method gives the opportunity to operate on every page of data in a particular order so as to access all pages before a duplication of page numbers occurs. Also, the pages replace into the minor loops in the same order that they were in before any operation occurred. That is, page 0 will physically reside in the same positions on the minor loops after operation.

To enable the operation of a magnetic bubble device on a multipage basis, it is necessary to separate the pages by some distance d. This d distance represents d periods of bubble propagation. In order to simplify control of the operations, it is desirable that d be a positive even integer. Since bubbles are read into the major propagation loop in every other position, those bubbles are operated on, that is detected, annihilated, replicated, or generated on every other cycle. In order to assure that each subsequent page is operated on the same every other cycle it is necessary to separate the first bubbles of those paages by an even integer distance apart.

A further requirement is that the distance d and the number of minor loop positions be mutually prime to avoid repetition of any page before the total number of pages has been accessed. Along with these requirements, it is obvious that the smallest d will result in the fastest effective data rate, i.e. physically we are striving for the smallest gap between successive pages that meet all of the above requirements.

An implicit weakness in the multipage transfer of data is that the data accessed is not sequential in a binary sense. That is, the first page of data accessed and the second page of data accessed are d distance away; i.e., if the first page accessed is page 0 and the distance d is 322 then the second page accessed is 322 and not page 1. This weakness becomes less important when the sequence of pages written into the bubble is in a multipage fashion, thus having page 1 written into page address 322 in the above example.

Although the present invention has been described in relation to specific embodiments, it should be apparent to those skilled in the art that various modifications may be made without departing from the spirit or scope of the present invention. For example, the controller described above may be applicable for use with serial memories other than memories of the magnetic domain type.

I claim:

1. A shift register type memory, comprising;
   a plurality of minor loops each of which has a plurality of bits,
   a major loop which is large enough to permit data of at least two blocks to simultaneously exist therein when data of one block from said minor loops are constructed of the same number of bits as the number of said minor loops,
   means for controlling transfer of the data between said major loop and said minor loops,
   means for generating first timing signals for transferring out a plurality of blocks into said major loop sequentially and successively at time intervals shorter than a period of time required for the data to travel round said major loop, and
   means for generating a second timing signal for transferring in the data having been already transferred out to said major loop by said first timing signal, to predetermined positions within said minor loops at a point of time between timings of the successive transfer-out operations.

2. A shift register type memory according to claim 1, wherein the number of blocks simultaneously existing in said major loop is two.

3. A shift register type memory according to claim 1, wherein the number of bits within said each minor loop is odd, and the number of bits within said major loop is even.

4. A shift register type memory according to claim 1, wherein intervals of generating said first timing signals for the transfer-out are constant irrespective of the blocks.

5. A shift register type memory according to claim 1, wherein said minor loops and said major loop are constructed of magnetic bubble transfer circuits on a magnetic sheet, and the data are stored by exploiting a state of existence of magnetic bubbles.

6. A method of operating a magnetic bubble memory device which includes a major propagation loop and a plurality of data storage minor loops operably associated therewith, wherein each minor loop has a plurality of bit positions for the storage of data as represented by a magnetic domain or a void, said method comprising:
   transferring a page of stored data in parallel from the plurality of minor loops into consecutive serially arranged bit positions of the major loop, wherein the page of stored data is defined by a plurality of bit positions extending across the plurality of minor loops and made up of a single bit position from each of the plurality of minor loops and disposed in the same virtual bit position therein common to each of the minor loops;
   propagating said first page of data around said major loop to a point on the major loop where replication/annihilation of said data occurs;
   transferring a second page of stored data in parallel from the plurality of minor loops into consecutive serially arranged bit positions of the major loop such that the first and second pages of data are a predetermined fixed distance d apart on the major loop;
   propagating both the first and second pages of data around the major loop until the second page of data reaches a point on the major loop where replication/annihilation of said second page of data occurs, while completing processing operations on said first page of data;

thereafter propagating both the first and second pages of data around said major loop until the first page of data is aligned with the plurality of minor loops; and transferring the first page of data in parallel from the serially arranged bit positions of said major loop into the respective bit positions of each of said minor loops as disposed in the same virtual bit position therein common to each of said minor loops.

7. A method of operating a magnetic bubble memory device as set forth in claim 6, wherein the distance d between the first and second pages of data on the major loop corresponds to a positive even number of bubble propagation periods.

8. A method of operating a magnetic bubble memory device which includes a major propagation loop and a plurality of data storage minor loops operably associated therewith, wherein each minor loop has a plurality of bit positions for the storage of data as represented by a magnetic domain or a void, said method comprising:

transferring a page of stored data in parallel from the plurality of minor loops into consecutive serially arranged bit positions of the major loop, wherein the page of stored data is defined by a plurality of bit positions extending across the plurality of minor loops and made up of a single bit position from each of the plurality of minor loops and disposed in the same virtual bit position therein common to each of the minor loops;

propagating said first page of data around said major loop to a point on the major loop where replication/annihilation of said data occurs;

transferring a second page of stored data in parallel from the plurality of minor loops into consecutive serially arranged bit positions of the major loop such that the first and second pages of data are a predetermined fixed distance d apart on the major loop, wherein the distance d between the first and second pages of data on the major loop corresponds to a positive even number of bubble propagation periods, and the distance d and the number of bit positions in each of said minor loops are mutually prime;

propagating both the first and second pages of data around the major loop until the second page of data reaches a point on the major loop where replication/annihilation of said second page of data occurs, while completing processing operations on said first page of data;

thereafter propagating both the first and second pages of data around said major loop until the first page of data is aligned with the plurality of minor loops; and transferring the first page of data in parallel from the serially arranged bit positions of said major loop into the respective bit positions of each of said minor loops as disposed in the same virtual bit position therein common to each of said minor loops.

* * * * *